(12) United States Patent
Lee et al.

(10) Patent No.: US 8,137,870 B2
(45) Date of Patent: Mar. 20, 2012

(54) METHOD OF MANUFACTURING PHOTOMASK

(75) Inventors: Myoung-soo Lee, Suwon-si (KR);
Young-su Sung, Gangwon-do (KR);
Hee-bom Kim, Seongnam-si (KR);
Min-kyung Lee, Anyang-si (KR);
Dong-gun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 80 days.

(21) Appl. No.: 12/383,640

(22) Filed: Mar. 26, 2009

(65) Prior Publication Data

US 2009/0191475 A1   Jul. 30, 2009

Related U.S. Application Data

(63) Continuation-in-part of application No. 11/446,765, filed on Jun. 5, 2006, now abandoned.

(30) Foreign Application Priority Data

Jun. 14, 2005 (KR) .................. 10-2005-0051118
Apr. 18, 2008 (KR) .................. 10-2008-0036208

(51) Int. Cl.
*G03F 1/00* (2006.01)

(52) U.S. Cl. .............................. 430/5; 430/30

(58) Field of Classification Search ........... 430/5, 22, 430/30; 382/144; 716/19, 21; 355/55, 67; 356/237.2
See application file for complete search history.

(56) References Cited

U.S. PATENT DOCUMENTS

| | | | |
|---|---|---|---|
| 6,866,969 B2 | 3/2005 | Miyamae et al. | |
| 6,894,774 B2 | 5/2005 | Nakanishi | |
| 7,123,356 B1 * | 10/2006 | Stokowski et al. | 356/237.2 |
| 2002/0021434 A1 * | 2/2002 | Nomura et al. | 355/55 |
| 2002/0058188 A1 | 5/2002 | Iwasaki et al. | |
| 2003/0030796 A1 | 2/2003 | Nakanishi | |
| 2004/0067422 A1 | 4/2004 | Park et al. | |
| 2004/0151992 A1 | 8/2004 | Nagamura et al. | |
| 2004/0214094 A1 | 10/2004 | Kim et al. | |
| 2005/0026050 A1 | 2/2005 | Ozawa et al. | |
| 2005/0136341 A1 * | 6/2005 | Park et al. | 430/5 |
| 2005/0238221 A1 * | 10/2005 | Hirano et al. | 382/144 |
| 2006/0092397 A1 * | 5/2006 | Laan et al. | 355/69 |
| 2007/0065729 A1 * | 3/2007 | Zait et al. | 430/5 |
| 2007/0065732 A1 | 3/2007 | Lee et al. | |

FOREIGN PATENT DOCUMENTS

| | | |
|---|---|---|
| JP | 11-338124 | 12/1999 |
| JP | 2001-297961 | 10/2001 |
| JP | 2002-156741 | 5/2002 |
| JP | 2002-174604 | 6/2002 |
| JP | 2004-054092 | 2/2004 |
| WO | 2005/008333 A2 | 1/2005 |

OTHER PUBLICATIONS

"Photomask Providing Uniform Critical Dimension on Semiconductor Device and Method of Manufacturing the Same" Specification, Drawings, and Prosecution History, of U.S. Appl. No. 11/446,765, filed Jun. 5, 2006, by Donggun Lee, et al., which is stored in the United States Patent and Trademark Office (USPTO) Image File Wrapper (IFW) System.

* cited by examiner

*Primary Examiner* — Mark F Huff
*Assistant Examiner* — Stewart Fraser
(74) *Attorney, Agent, or Firm* — Onello & Mello, LLP

(57) ABSTRACT

A method of manufacturing a photomask includes: providing a photomask; exposing the photomask to obtain an aerial image of the photomask and evaluating the photomask using the aerial image; and altering an optical parameter of the photomask associated with the aerial image according to the result of evaluation.

19 Claims, 12 Drawing Sheets

METHOD OF MANUFACTURING PHOTOMASK

CROSS-REFERENCE TO RELATED APPLICATIONS

This application is Continuation-In-Part application of U.S. patent application Ser. No. 11/446,765, filed on Jun. 5, 2006, which relies for priority on Korean Patent Application No. 10-2005-0051118, filed in the Korean Intellectual Property Office on Jun. 14, 2005. This application also relies for priority on Korean Patent Application No. 10-2008-0036208, filed in the Korean Intellectual Property Office on Apr. 18, 2008. The contents of all of the above applications are incorporated herein in their entirety by reference.

BACKGROUND

The inventive concept relates to a method of manufacturing a semiconductor, and to a method of manufacturing a photomask used in photolithography.

A plurality of circuit patterns (or photoresist patterns) are formed on a wafer by using a photolithography process. In particular, as the design rule of a semiconductor device decreases, the importance of critical dimension (CD) uniformity of semiconductor patterns increases.

The CD uniformity of semiconductor patterns is affected by optical elements such as a light source, a lens, and an aperture. Highly-integrated devices are affected by CD uniformity of photomask patterns. The CD uniformity of mask patterns must increase so as to increase the CD uniformity of circuit patterns formed on the wafer.

The CDs of mask patterns may be measured and corrected using a scanning electron microscope (SEM) method or an optical critical dimension (OCD) method. In the SEM method, the CDs of a large number of photomask patterns are directly measured using electron beams so as to adjust the global uniformity of photomasks by accounting for measurement errors of equipment and local CD errors of the photomasks. However, in a current mass production process, only local CDs of photomask patterns are measured so as to increase production efficiency. Thus, the global uniformity of photomasks cannot be accurately corrected using the SEM method.

In the OCD method, after photoresist patterns are formed on a wafer using a photolithography process, CDs of photomasks are determined by measuring the reflection index (or reflection spectrum) of the photoresist patterns, and the measured CDs are corrected. In order to correct the CDs of mask patterns in the OCD method, parameters such as CDs of photoresist patterns, CD change amount due to the exposure energy (intensity of exposure source) during the photolithography process, and a CD correction amount according to an exposure condition must be measured. In this case, in order to measure and correct the CDs of photomasks using the OCD method, the photolithography process must include an exposure process, and the correction parameters must be measured. Thus, process time increases, which lead to an increase in the cost of the manufacturing process. Thus, a method for obtaining the correct global uniformity of photomasks without performing the photolithography process is required.

In addition, when using the OCD method, the measurement equipment for measuring a reflection index can be used to measure only the resultant shape of a diffraction pattern and thus cannot be used to measure a variety of patterns that are commonly used.

SUMMARY

According to an aspect of the inventive concept, there is provided a method of manufacturing a photomask. According to the method, a photomask is provided, and the photomask is exposed to obtain an aerial image of the photomask. The photomask is evaluated using the aerial image. An optical parameter of the photomask associated with the aerial image is altered according to the result of the evaluation.

The exposing of the photomask to obtain the aerial image may be performed using the same illumination system as the illumination system used to transfer the photomask onto a wafer.

The obtaining of the aerial image may include using at least one of −primary light and +primary light together with zero-order light that reacts with the photomask.

The optical parameter may be a transmittance or a reflection index.

The evaluating of the photomask may include comparing the aerial image with a design shape of the photomask and/or comparing a measurement critical dimension (CD) of the aerial image and a design CD of the photomask.

The altering of the optical parameter may include altering a transmittance of the photomask based on the measurement CD and the design CD.

The altering of transmittance of the photomask may include forming a diffraction array comprising a plurality of spots in the photomask and/or forming auxiliary patterns beside patterns of the photomask and/or forming grooves in a surface on which patterns of the photomask are formed.

Altering the optical parameter may include altering a reflection index of the photomask based on the measurement CD and the design CD. The altering of the reflection index of the photomask may include irradiating laser on the photomask.

According to another aspect of the inventive concept, there is provided a method of manufacturing a photomask. According to the method, a photomask comprising a plurality of sections is provided. The photomask is exposed to obtain an aerial image of the photomask according to each of the plurality of sections. A measurement critical dimension (CD) of the aerial image is compared with a design CD of the photomask to evaluate the photomask. An optical parameter of the photomask associated with the aerial image is altered with respect to at least one of the plurality of sections according to the result of evaluation.

In one embodiment, exposing the photomask to obtain the aerial image comprises using the same illumination system as an illumination system used to transfer the photomask onto a wafer.

In one embodiment, obtaining the aerial image includes using zero-order light, −primary light and +primary light that reacts with the photomask.

In one embodiment, altering the optical parameter includes altering a transmittance of the photomask based on the measurement CD and the design CD.

In one embodiment, altering a transmittance of the photomask includes forming a diffraction array including a plurality of spots in the photomask.

In one embodiment, altering a transmittance of the photomask includes at least one of: (i) forming auxiliary patterns beside patterns of the photomask, and (ii) forming grooves in a surface on which patterns of the photomask are formed.

In one embodiment, altering the optical parameter comprises altering the reflection index of the photomask based on the measurement CD and the design CD.

BRIEF DESCRIPTION OF THE DRAWINGS

Exemplary embodiments of the inventive concept will be more clearly understood from the following detailed description taken in conjunction with the accompanying drawings.

DETAILED DESCRIPTION OF THE EMBODIMENTS

Figure 1:
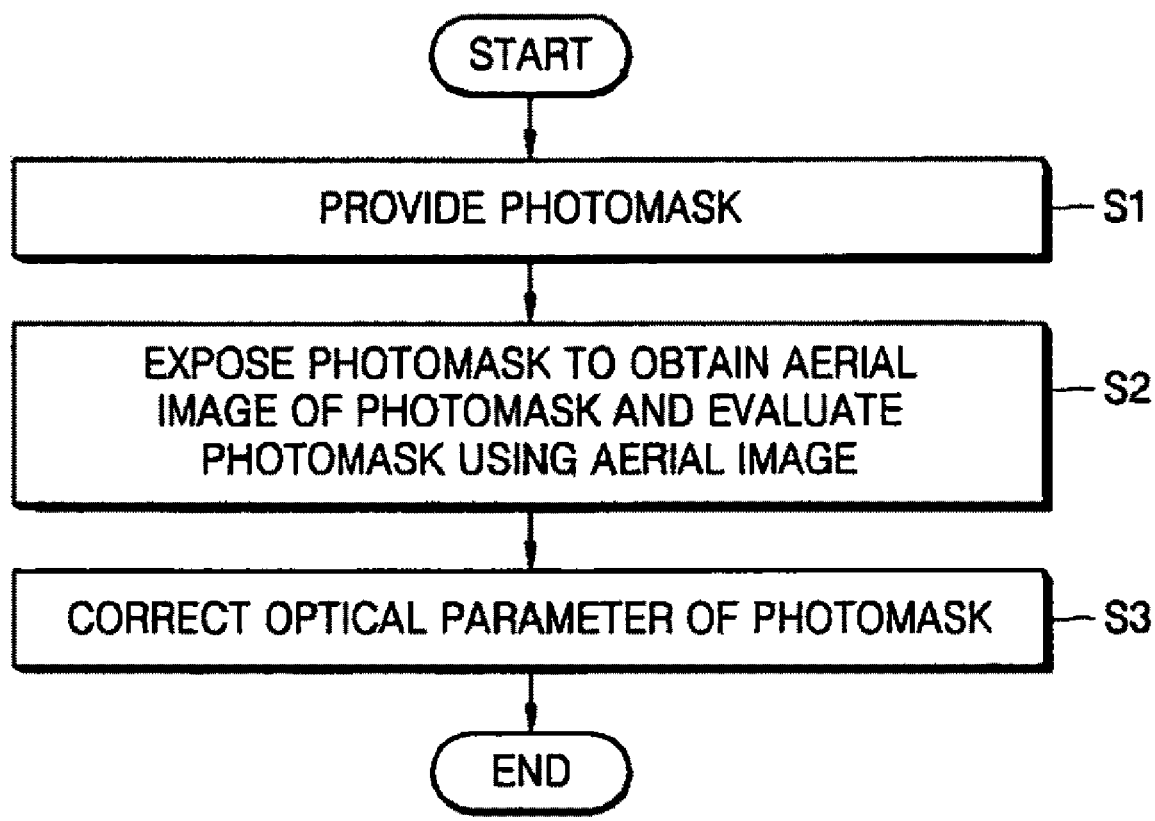
FIG. 1 is a flowchart illustrating a method of manufacturing a photomask according to an exemplary embodiment.

The inventive concept will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this description will be thorough and complete, and will fully convey the invention to those skilled in the art. In the drawings, the thicknesses of layers and regions are exaggerated for clarity.

A photomask according to embodiments of the inventive concept that is used in photolithography and may also be referred to as a reticle. Patterns formed on a photomask by using photolithography may be transferred onto a substrate, for example, a wafer.

Figure 2:
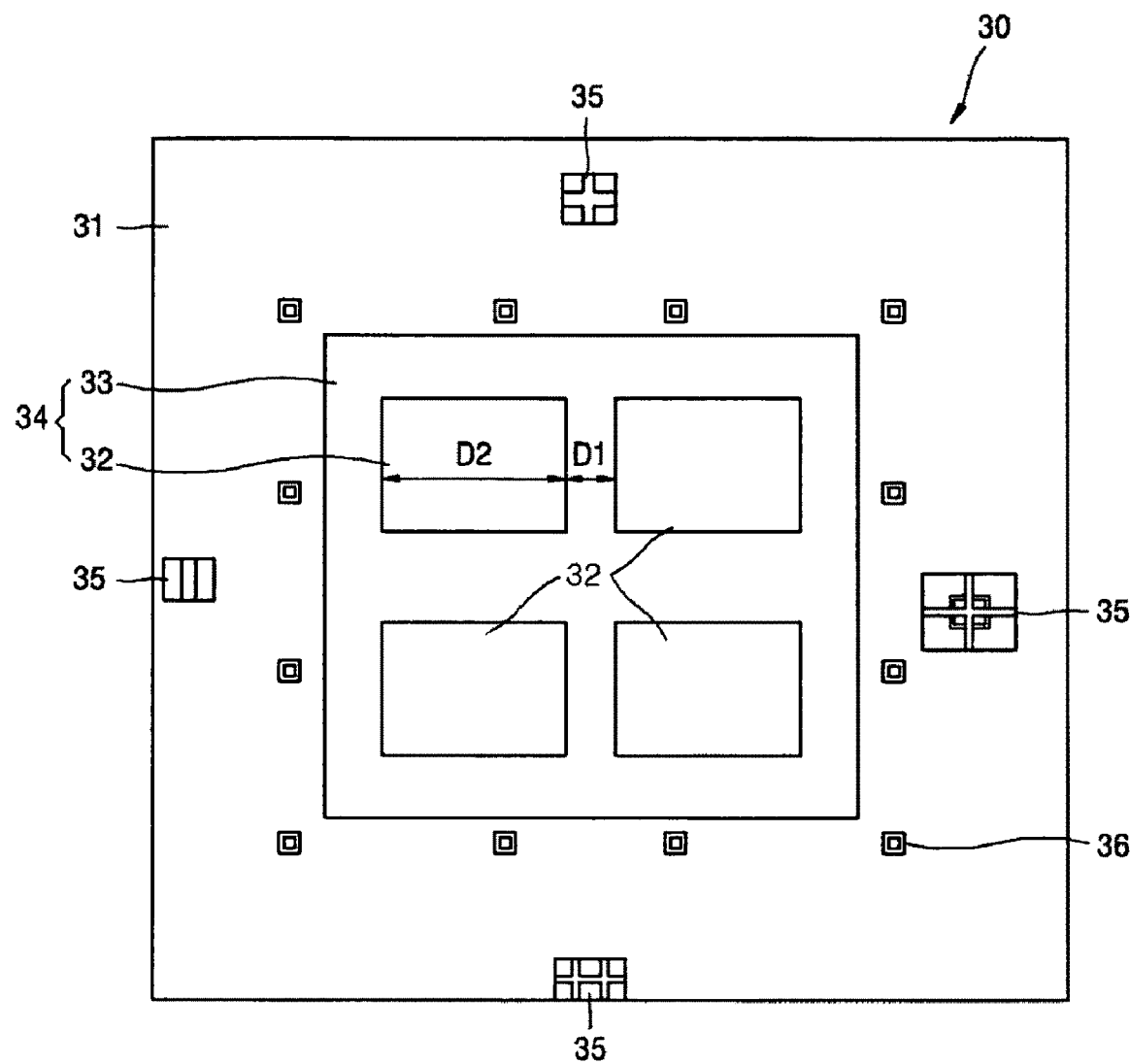
FIG. 2 is a plan view of a photomask according to an exemplary embodiment.

FIG. 1 is a flowchart illustrating a method of manufacturing a photomask according to an exemplary embodiment, and FIG. 2 is a plan view of a photomask according to an exemplary embodiment.

Referring to FIGS. 1 and 2, a photomask 30 may be provided in operation S1. The photomask 30 may comprise mask patterns (see reference numeral 37a of FIG. 3) for forming circuit patterns on a substrate 31. The photomask 30 may comprise a plurality of sections. For example, the photomask 30 may comprise a plurality of cell array regions 32 on the substrate 31 and may further comprise a peripheral circuit region 33 surrounding the cell array regions 32. The cell array regions 32 and the peripheral circuit region 33 may constitute a chip region 34. Each of the sections may be each cell array region 32 or a specific region in each cell array region 32.

When the photomask 30 is a binary mask, each of the mask patterns (see reference numeral 37a of FIG. 3) may be a shielding pattern such as chromium, and when the photomask 30 is a phase shift mask, each of the mask patterns (see reference numeral 37a of FIG. 3) may be a phase shift pattern. Alignment keys 35 having various shapes may be formed outside the chip region 34, and keys 36 for measuring registration may be formed along the perimeter of the chip region 34.

The photomask 30 may be formed by the operations of forming a mask layer on the substrate 31 and pattering the mask layer to form the mask patterns (see reference numeral 37a of FIG. 3) and the keys 35 and 36. As described above, the mask layer may be a shielding layer or a phase shift layer.

The mask patterns (see reference numeral 37a of FIG. 3) may be manufactured to have a predetermined design critical dimension (CD) according to sections of the photomask 30. However, due to various errors in the manufacturing operation, the mask patterns (see reference numeral 37a of FIG. 3) may be manufactured outside the range of the design CD. Accordingly, the CD distribution of the photomask 30 may be nonuniform.

Subsequently, the photomask 30 is exposed, such that an aerial image can be obtained and the photomask 30 can be evaluated. In this exemplary embodiment, the aerial image may be an image formed on a reference surface when the photomask 30 is exposed. Thus, the aerial image may be different from an imaginary aerial image that is formed by simulating an exposure condition. This is because the imaginary aerial image may be greatly affected by a simulation conditions, and the simulation conditions do not accurately reflect the exposure conditions.

In this exemplary embodiment, the aerial image may be formed under almost the same conditions as the conditions used when the photomask 30 is transferred onto the wafer. Specifically, the same illumination system as the illumination system used in an exposure operation of transferring the photomask 30 onto the wafer may be used in an exposure operation of the photomask 30 for creating the aerial image. For example, when the aerial image is obtained, at least one of −primary light and +primary light may be used together with zero-order light that reacts with the photomask 30, and for example, all of zero-order light, −primary light, and +primary light may be used. Thus, the aerial image according to this exemplary embodiment is suitable for use in detecting a defect or uniformity of the photomask 30 under the actual exposure conditions.

Figure 3:
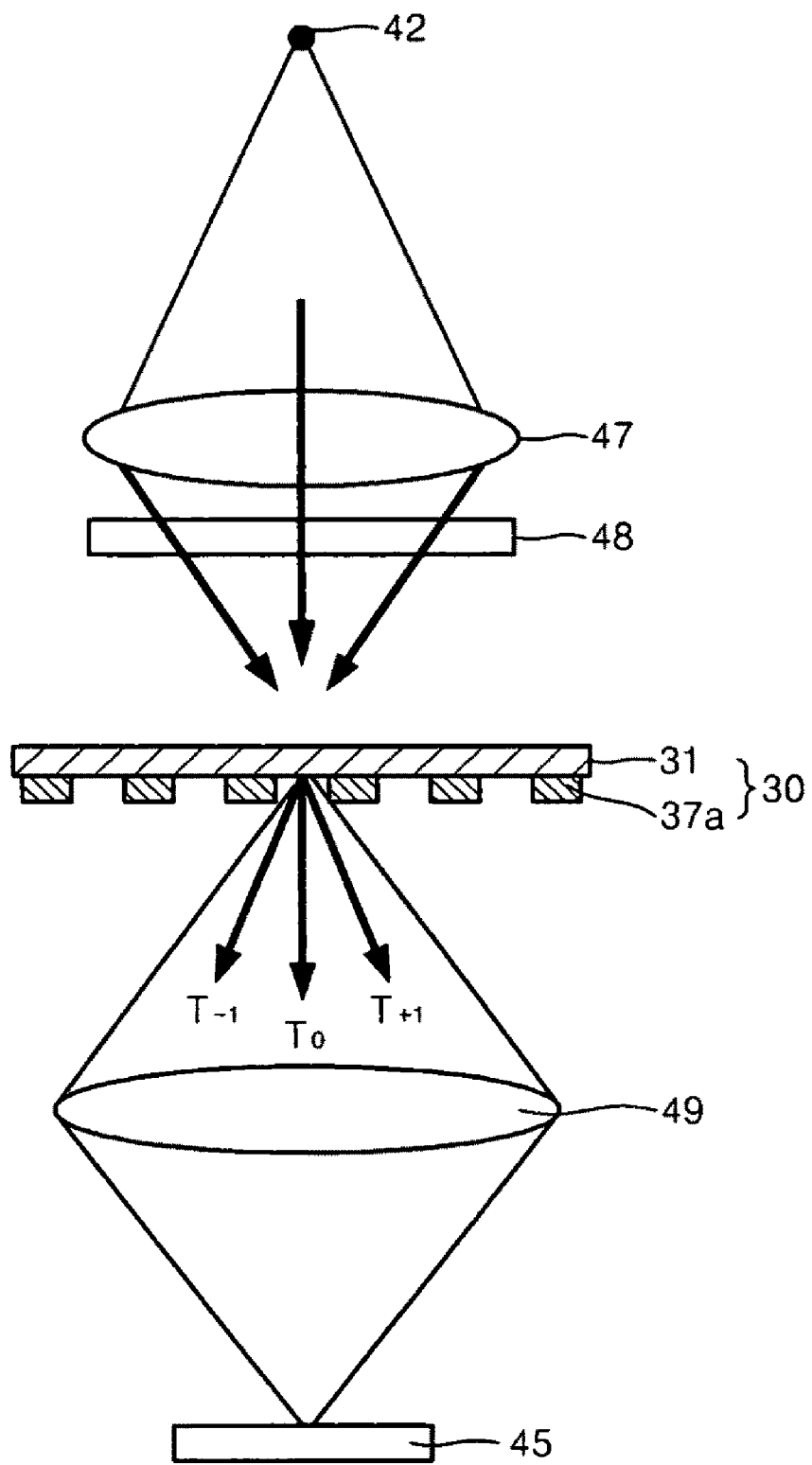
FIG. 3 is a schematic view of an apparatus for obtaining an aerial image of a photomask according to an exemplary embodiment.

FIG. 3 is a schematic view of an apparatus for obtaining an aerial image according to an exemplary embodiment. Referring to FIG. 3, radiation such as light irradiated by a radiation or light source 42 may be transferred onto the photomask 30 via a condenser lens 47 and an illumination system 48. The light source 42 may generate light having different wavelengths and may generate, for example, deep ultra violet (DUV) light having a wavelength less than 193 nm, for example. The illumination system 48 may use the same scanner system as a scanner system used for wafer exposure. Thus, both on-axis illumination and off-axis illumination can be readily performed using the illumination system 48.

All of zero-order light $T_0$, −primary light $T_{-1}$, and +primary light $T_{+1}$ that transmit the mask patterns 37a of the photomask 30 are transferred to a detector 45 via a projection lens 49. The detector 45 may obtain an aerial image that is realized with zero-order light $T_0$, −primary light $T_{-1}$, and +primary light $T_{+1}$. For example, the detector 45 may comprise an electronic device including a photodiode, such as a charge coupled device (CCD) or a complementary metal-oxide semiconductor (CMOS) image sensor (CIS).

The detector 45 is very similar to a wafer exposure system except that light transmitted to the photomask 30 is not transferred onto the wafer. Thus, an aerial image that is very similar to patterns to be transferred onto the wafer can be obtained using the detector 45.

The detector 45 is used to form an aerial image using light transmitted through the photomask 30, but may be also used to obtain an aerial image using light reflected from the photomask 30.

Referring back to FIGS. 1 and 2, as described above, in operation S2, the photomask is exposed and an aerial image of the photomask is obtained and the photomask is evaluated using the aerial image of the photomask. In operation S3, the optical parameter of the photomask 30 may be corrected according to the above-described evaluation result. For example, when the photomask 30 is classified into sections, the optical parameter of the photomask with respect to at least one section may be corrected. In this exemplary embodiment, the optical parameter may be associated with the aerial image. That is, the aerial image may be changed by correcting the optical parameter. For example, in this exemplary embodiment, the optical parameter may be transmittance or a reflection index.

The optical parameter may be corrected by comparing the design shape of the photomask 30 with the aerial image obtained in operation S2. For example, the design CD of the photomask 30 and the measurement CD of the aerial image may be compared with each other.

Figure 4:
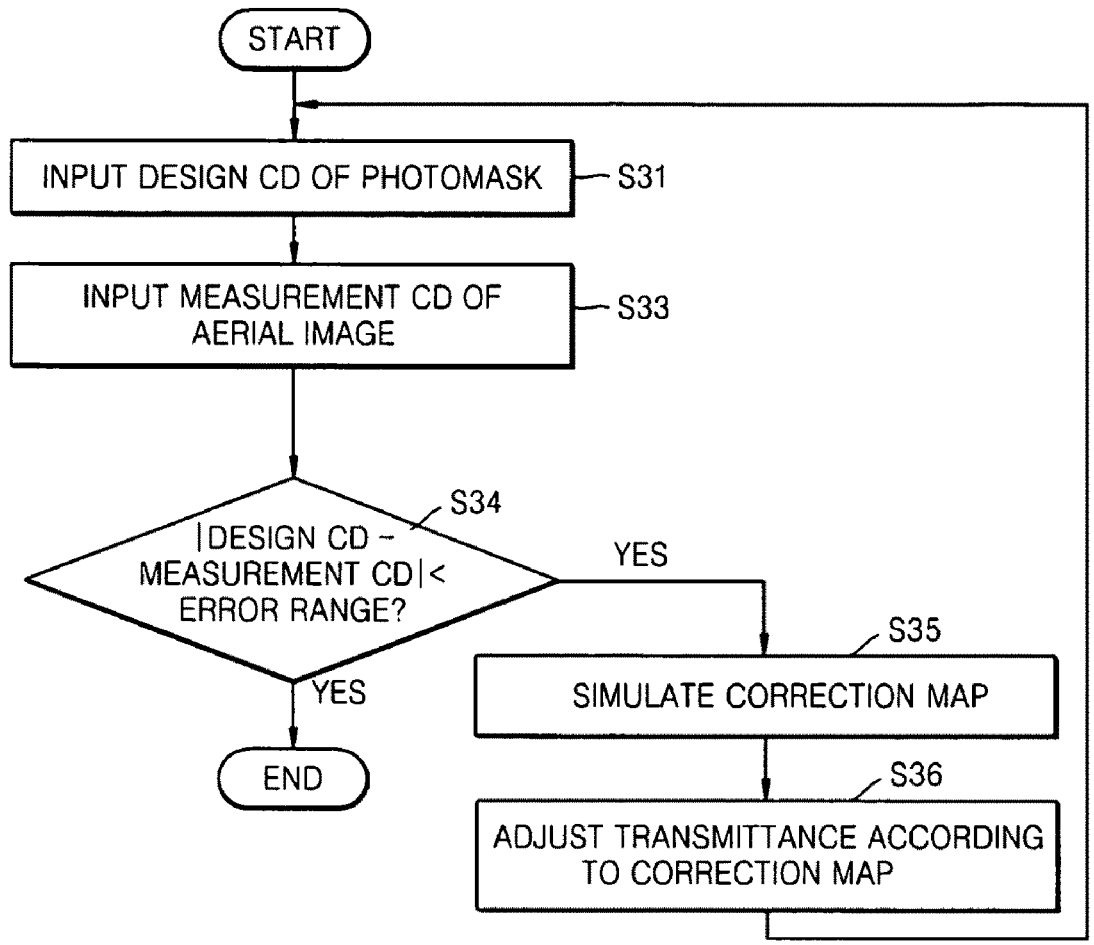
FIGS. 4 through 6 are flowcharts illustrating a method for correcting a photomask according to another exemplary embodiment.
Figure 5:
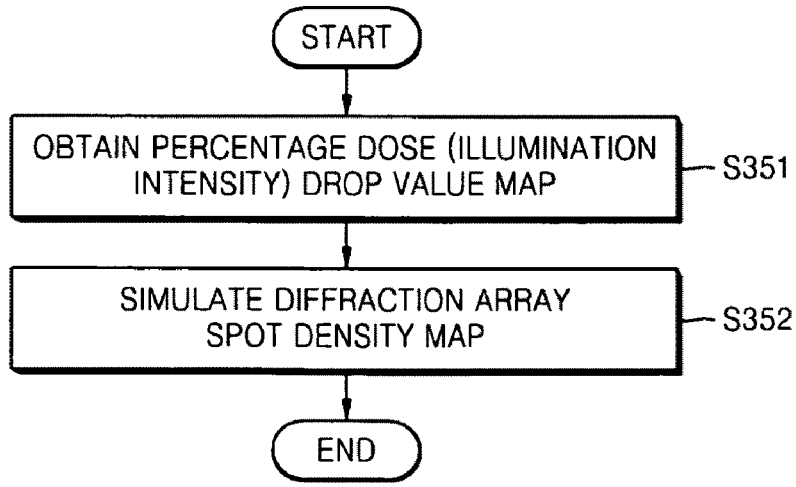
Figure 6:
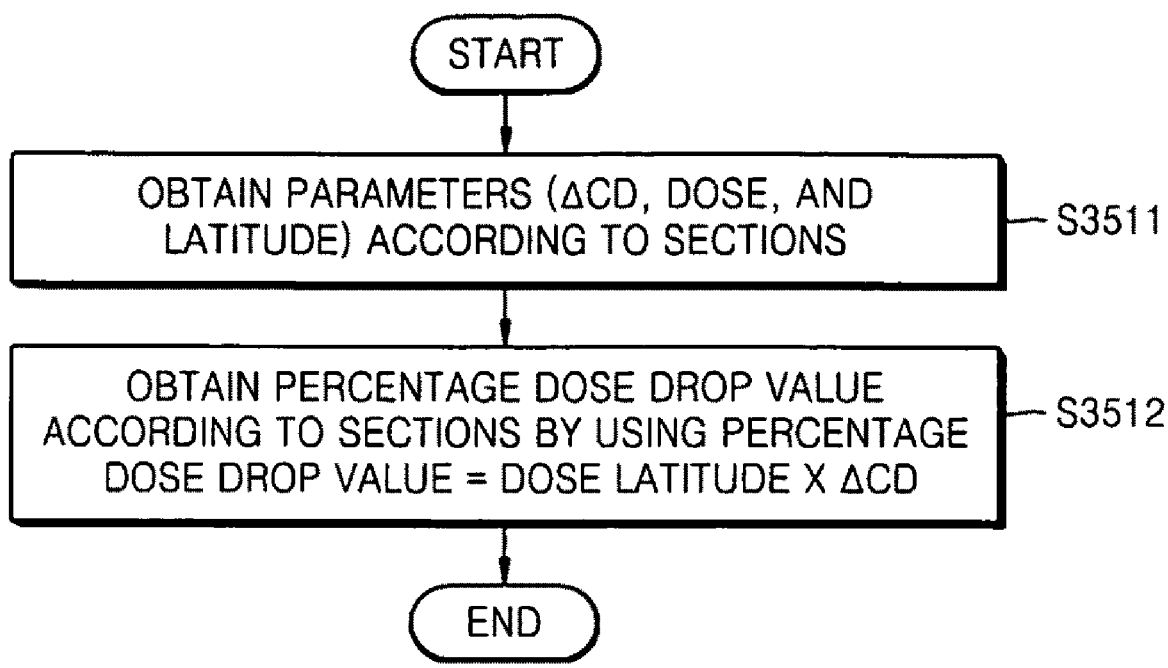

FIGS. 4 through 6 are flowcharts illustrating a method for correcting a photomask according to another exemplary embodiment.

Referring to FIG. 4, the design CD of the photomask 30 may be inputted in operation S31. As described in connection with FIG. 2, a design CD is a target CD when the photomask 30 is manufactured. The design CD may be obtained according to sections of the photomask 30.

Subsequently, the CD of the aerial image detected by exposing the photomask 30 in operation S2 of FIG. 1 is measured, and the measured value may be inputted as a measurement CD in operation S33. The measurement CD may be obtained according to sections of the photomask 30.

Subsequently, it may be determined whether the absolute value of a difference between a design CD and a measurement CD is in the allowable error range in operation S34. If the absolute values of the design CD and the measurement CD are the same, the photomask 30 is regarded as an ideal photomask. However, the absolute value of the difference between the design CD and the measurement CD according to sections of the photomask 30 may vary according to errors and the degree of optimization of an exposure condition when the photomask 30 is manufactured. Thus, an allowable process margin in a process using the photomask 30 is set to be in the allowable range so that it can be determined whether the absolute value of the difference between the design CD and the measurement CD is in the allowable range.

If the absolute value of the difference between the design CD and the measurement CD is in the allowable range, a correction operation may be ended. However, if the absolute value of the difference between the design CD and the measurement CD is not in the allowable range, the correction operation is needed. For example, a correction map may be simulated based on the difference in operation S35. The operation (S35) of simulating the correction map will now be described with reference to FIG. 5.

Referring to FIG. 5, a percentage dose (illumination intensity) drop value map that affects an aerial image is obtained in operation S351, and a correction map for making transmittance uniform according to sections of the photomask 30 may be generated using the percentage dose (illumination intensity) drop value map in operation S352. Specifically, in operation S352, a diffraction array spot density map may be simulated.

The operation of obtaining the percentage dose (illumination intensity) drop value map will now be described in greater detail with reference to FIG. 6. Referring to FIG. 6, parameters for obtaining a percentage dose (illumination intensity) drop value according to sections after dividing the photomask 30 into sections, for example, a CD deviation distribution map and a dose latitude, in operation S3511. Subsequently, the percentage dose (illumination intensity) drop value map may be obtained using the CD deviation and the dose latitude in operation S3512.

In this case, the CD deviation distribution map may be obtained using operations of dividing the photomask 30 into sections or meshes and measuring CDs of mask patterns formed in each of the sections or the meshes using the transmittance, and the CD deviation distribution map according to sections may be obtained based on a section having the smallest CD. In addition, the dose latitude (CD/% dose) is obtained by measuring a change in CD of the photomask 30 according to a change in the percentage dose (illumination intensity) by changing the percentage dose (illumination intensity) while using an exposure condition used to measure the CD deviation distribution map. Exposure doses are illustrated on the x-axis, and the CD of the photomask 30 is illustrated on the y-axis, and a straight-line slope connecting measured values illustrated on an x-y plane is obtained. Next, the percentage dose (illumination intensity) used in a current exposure process is multiplied by the straight-line slope, thereby obtaining dose latitude. In addition, the percentage dose (illumination intensity) drop value map may be obtained by multiplying the dose latitude by the CD deviation, and the percentage dose (illumination intensity) drop value is obtained according to sections, thereby obtaining the percentage dose (illumination intensity) drop value map (i.e., percentage dose).

Referring back to FIG. 4, when the percentage dose (illumination intensity) drop value map, i.e., the correction map, is obtained, as described above, the transmittance of the photomask 30 may be adjusted based on the correction map in operation S36. The transmittance of the photomask 30 may be adjusted by forming a diffraction array adjusting the intensity and shape of illumination in the substrate 31, for example. When the diffraction array is formed in the substrate 31, a diffraction array spot density map is obtained in operation S352 of FIG. 5 to correspond to the correction map. The diffraction array spot density map is obtained using Equation 1.

$$I=1-4(d^2/p^2); \quad (1)$$

where I corresponds to a percentage dose (illumination intensity) drop value, d is the diameter of a spot, and p is the pitch of the spot. That is, the percentage dose (illumination intensity) drop value may be obtained according to Equation 1 as a function of the diameter of the spot and the pitch of the spot by using Equation 1.

Subsequently, the operations S31 through S36 may be repeatedly performed until the difference between the absolute value of the difference between the design CD and the measurement CD is in the allowable range.

Figure 7:
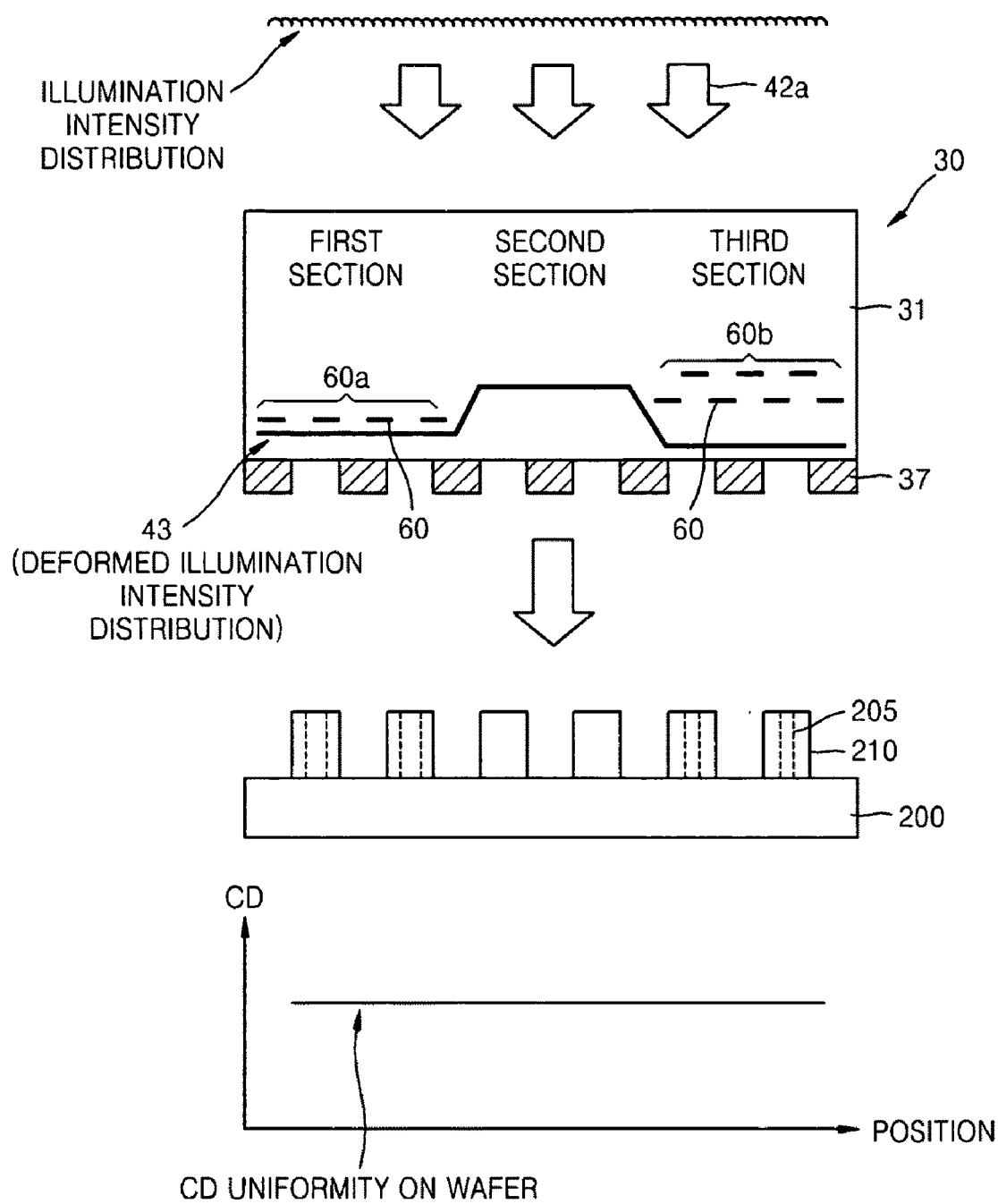
FIG. 7 schematically illustrates CD uniformity achieved on a wafer using a photomask in which a diffraction array is formed, according to an exemplary embodiment.

FIG. 7 schematically illustrates CD uniformity achieved on a wafer by using a photomask in which a diffraction array is formed, according to an exemplary embodiment.

Referring to FIG. 7, a first section in which a first diffraction array 60a is formed in the photomask 30, a second section in which a diffraction array is not formed, and a third section in which a second diffraction array 60b is formed, are illustrated. The density of the first diffraction array 60a may be smaller than the density of the second diffraction array 60b. The density may be adjusted by changing the pitches of spots 60 having the same size. As a result, the intensity of light (or illumination) that passes the second section in which the diffraction array is not formed is the largest, and the intensity of light (or illumination) that passes the second diffraction array 60b is the smallest, and the intensity of light (or illumination) that passes the first diffraction array 60a is a middle value of the intensities.

As a result, the illumination intensity distribution of light in the photomask 30 is deformed, and light of the deformed illumination intensity distribution 43 may pass the mask pattern 37 and may be transferred onto a wafer 200. Thus, patterns 210 having uniform CD instead of conventional patterns 205 having nonuniform CDs may be printed on the wafer 200. In this way, diffraction arrays having different densities according to sections of the photomask 30 are formed so that the CD uniformity of the photomask 30 is improved and the shot uniformity of the wafer 200 can be improved.

The spots 60 may be obtained by irradiating energy light having a predetermined density at which a substrate medium is not molten and/or vaporized but at which a refractive index is changed, for example, femto second laser. For example, FIG. 8 schematically illustrates a laser device used in manufacturing a photomask according to exemplary embodiments.

Figure 8:
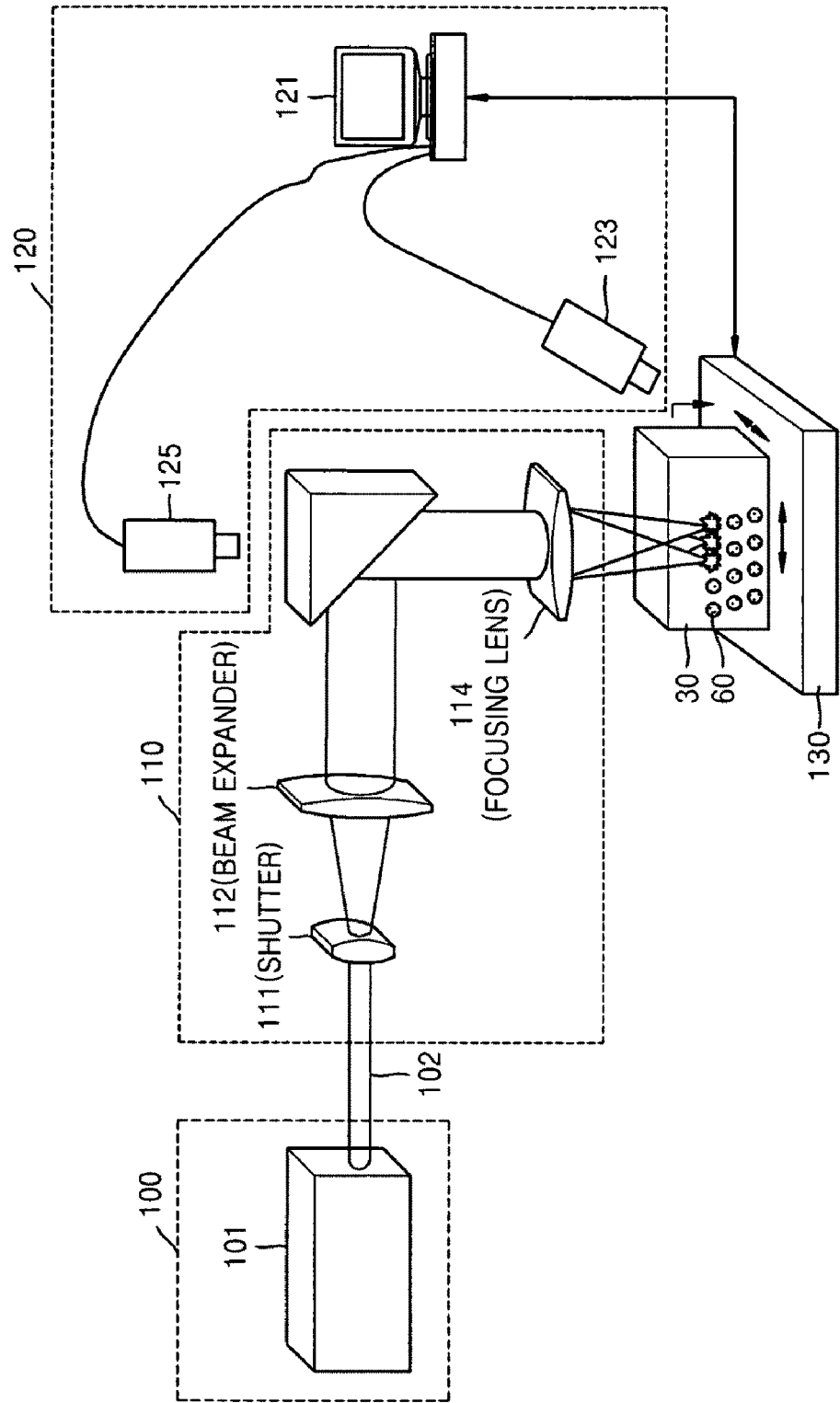
FIG. 8 schematically illustrates a laser system used in manufacturing a photomask according to an exemplary embodiment.

Referring to FIG. 8, the laser device may comprise a laser generation unit 100, a laser processor 110, a controller 120, and a stage 130. The photomask 30 is loaded on the stage 130 that is controlled by the controller 120 to be movable along the x-axis and the y-axis. Next, a laser generator or source 101 of the laser generation unit 100 generates a titanium sapphire laser beam 102 having a pulse duration time of $7 \times 10^{-12}$ s (7 ps) and a maximum peak output per unit area of approximately $10^{13}$ to $10^{14}$ W/cm².

The laser beam 102 is irradiated on the photomask 30 of the stage 130 via a shutter 111, a beam expander 112, and a focusing lens 114 of the laser processor 110. As a result, the spots 60 are formed in the substrate of the photomask 30. In this case, the shape of the diffraction arrays formed in the photomask 30 is controlled by a control device 121 such as a computer, in the controller 120. Charge-coupled device (CCD) cameras 123 and 125 may be provided for use in monitoring. In addition, the focus of the laser beam 102 is adjusted so that a multi-layer diffraction array 60b can also be implemented.

Figure 9:
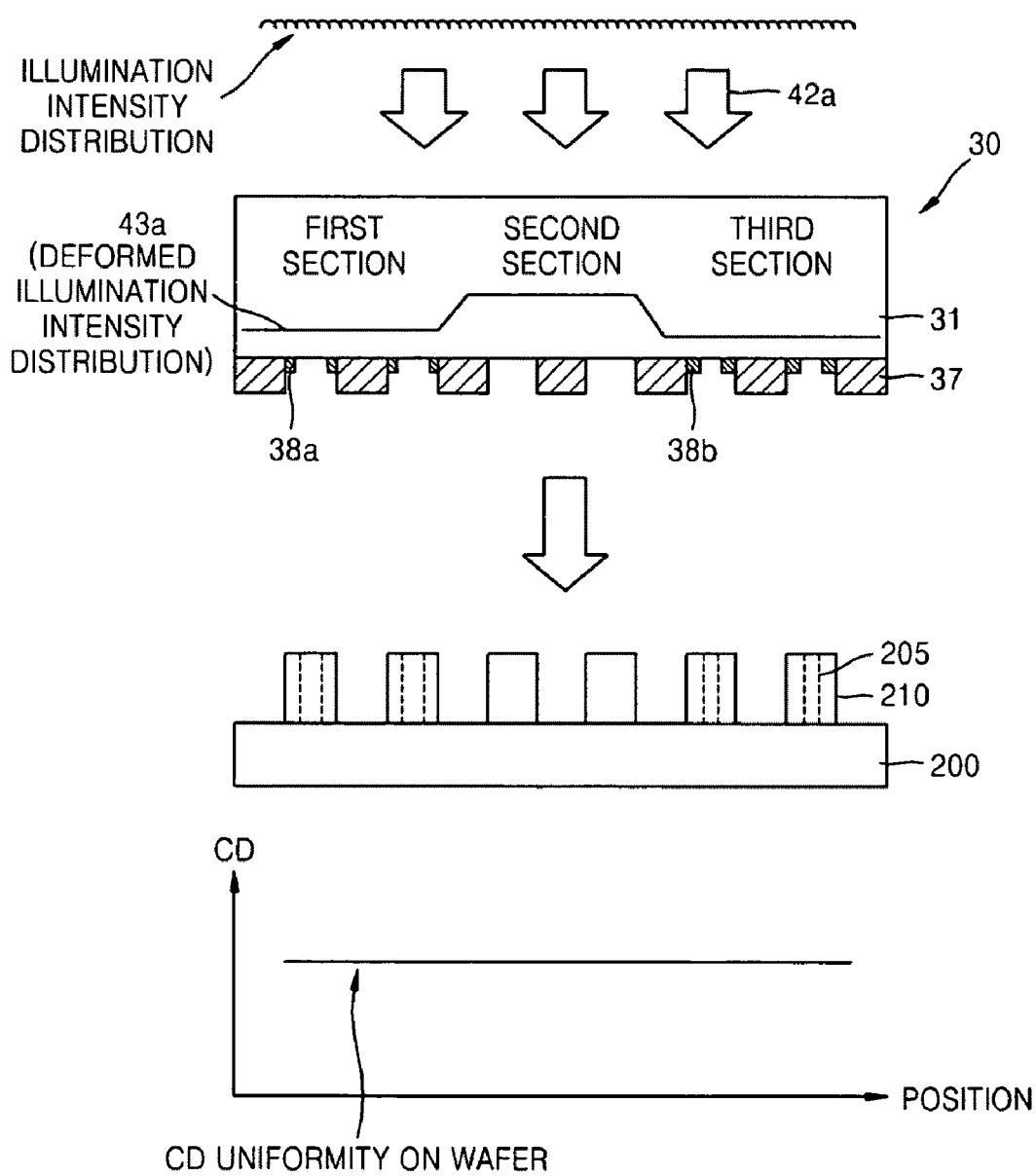
FIG. 9 schematically illustrates CD uniformity achieved on a wafer using a photomask in which auxiliary patterns are formed, according to another exemplary embodiment.

FIG. 9 schematically illustrates CD uniformity achieved on a wafer by using a photomask in which auxiliary patterns are formed, according to another exemplary embodiment.

Referring to FIG. 9, auxiliary patterns 38a and 38b may be formed according to a correction map obtained by the transmittance distribution of sections so as to adjust transmittance. In this case, the distribution of transmittance and illumination intensity may be adjusted by the widths or sizes of the auxiliary patterns 38a and 38b. In this way, although the auxiliary patterns 38a and 38b are formed according to the transmittance distribution of sections, the uniformity of the wafer according to shots can be improved.

Figure 10:
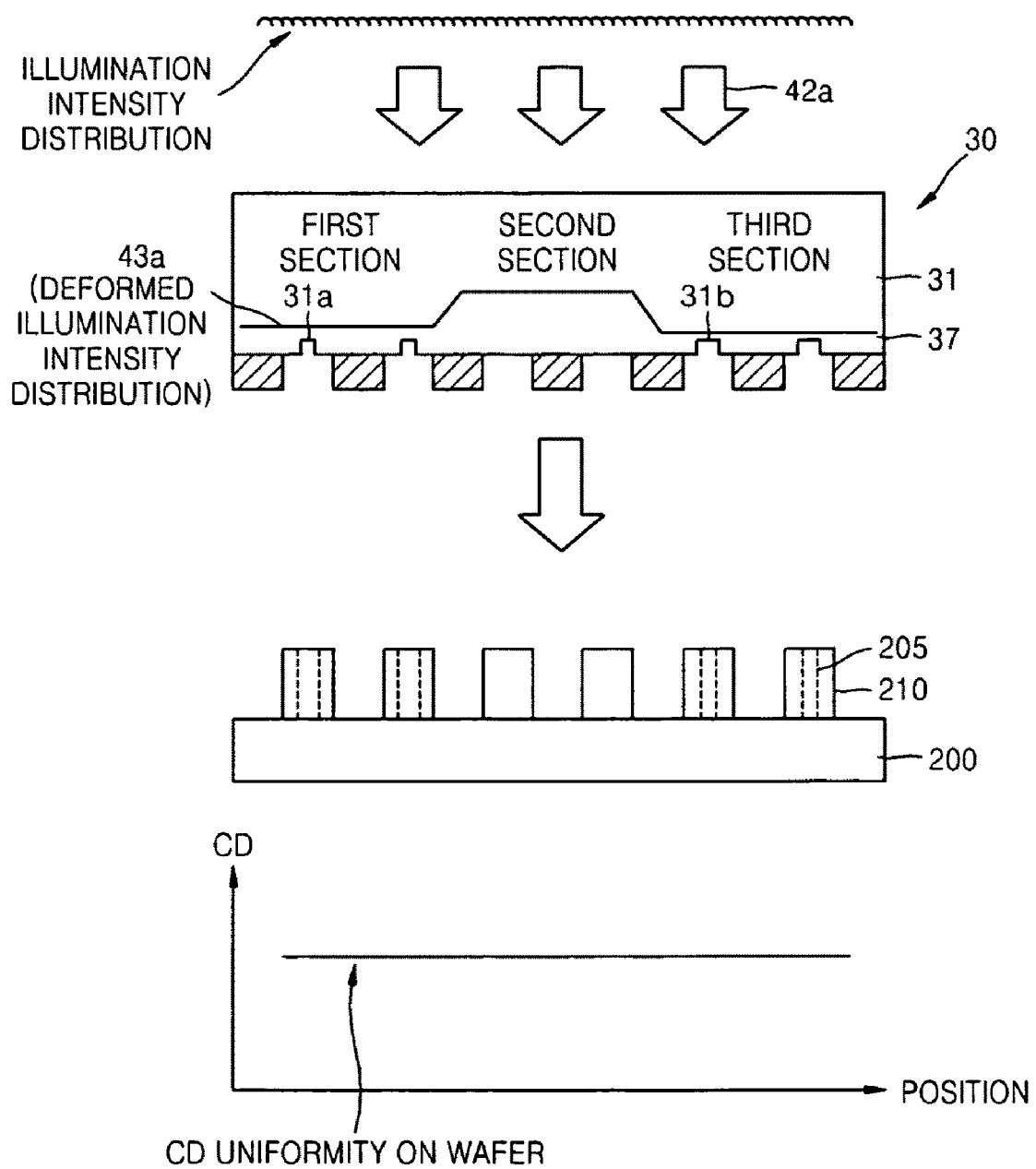
FIG. 10 schematically illustrates CD uniformity achieved on a wafer using a photomask in which grooves are formed, according to another exemplary embodiment.

FIG. 10 schematically illustrates CD uniformity achieved on a wafer by using a photomask in which grooves are formed, according to another exemplary embodiment.

Referring to FIG. 10, grooves 31a and 31b may be formed in a surface on which patterns of the photomask 30 are formed, according to the correction map obtained by the transmittance distribution of sections so as to adjust light transmittance. In this case, transmittance distribution and illumination intensity may be adjusted by the sizes and depths of the grooves 31a and 31b, and the grooves 31a and 31b are formed in sections of the photomask 30 based on the correction map, thereby improving the shot uniformity of the wafer 200.

Figure 11:
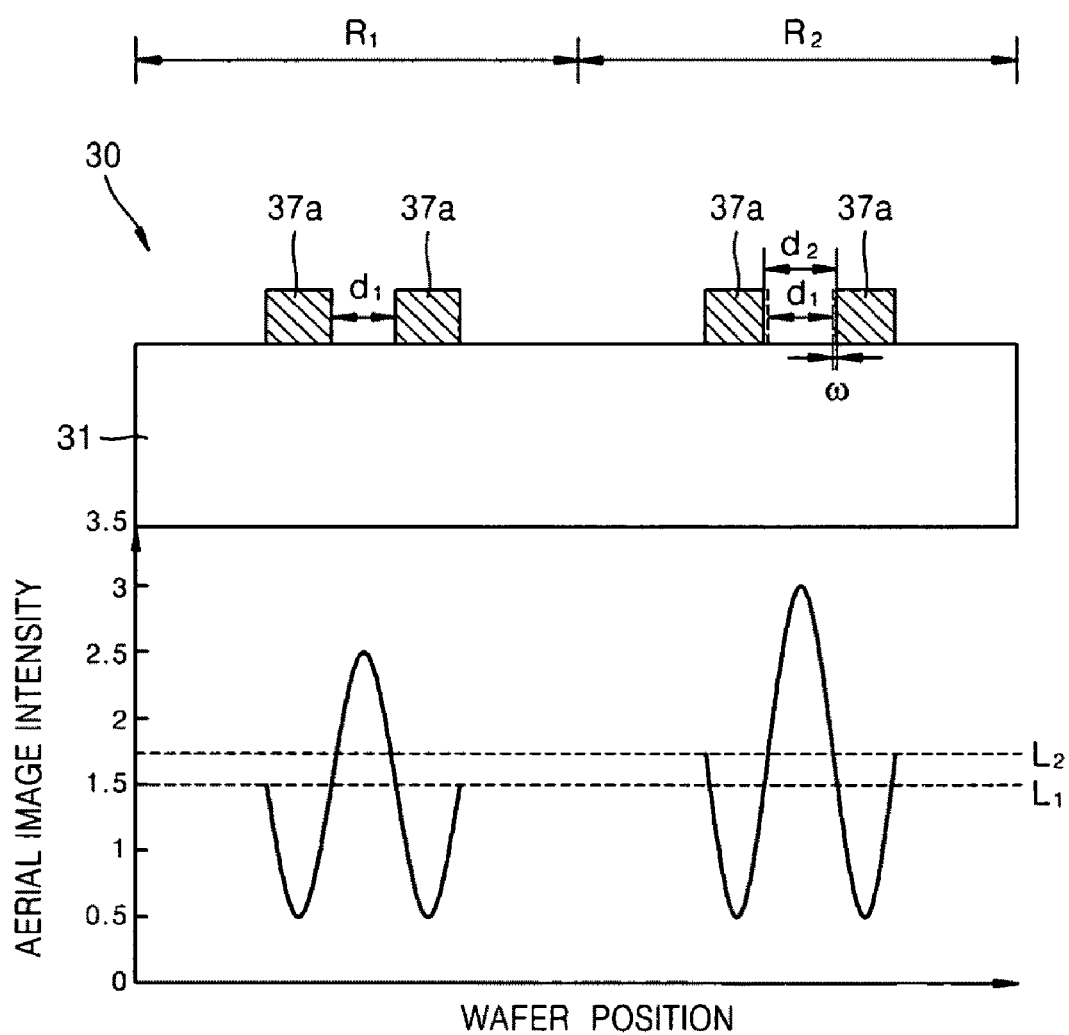
FIG. 11 illustrates a photomask having a nonuniform CD and its aerial image intensity.

FIG. 11 illustrates a photomask having a nonuniform CD and its aerial image intensity.

Referring to FIG. 11, the photomask 30 may comprise a first region $R_1$ having a normal distance (or normal CD) $d_1$ and a second region $R_2$ having an abnormal distance $d_2$ based on the mask patterns 37a. The abnormal distance $d_2$ corresponds to $d_1 + 2\omega$, and $\omega$ is smaller than the wavelength $\lambda$ of a light source and the normal distance $d_1$ ($\omega \gg \lambda < CD$). The intensity of the aerial image detected by exposing the photomask 30 may be different due to the CDs of the mask patterns 37a, for example, the difference between the distances $d_1$ and $d_2$. Here, when the vibration axis $L_2$ of an image intensity curve corresponding to the second region $R_2$ is inversely corrected to be the same as the vibration axis $L_1$ of an image intensity curve corresponding to the second region $R_1$, the transmittance of the second region $R_2$ may be corrected.

Figure 12:
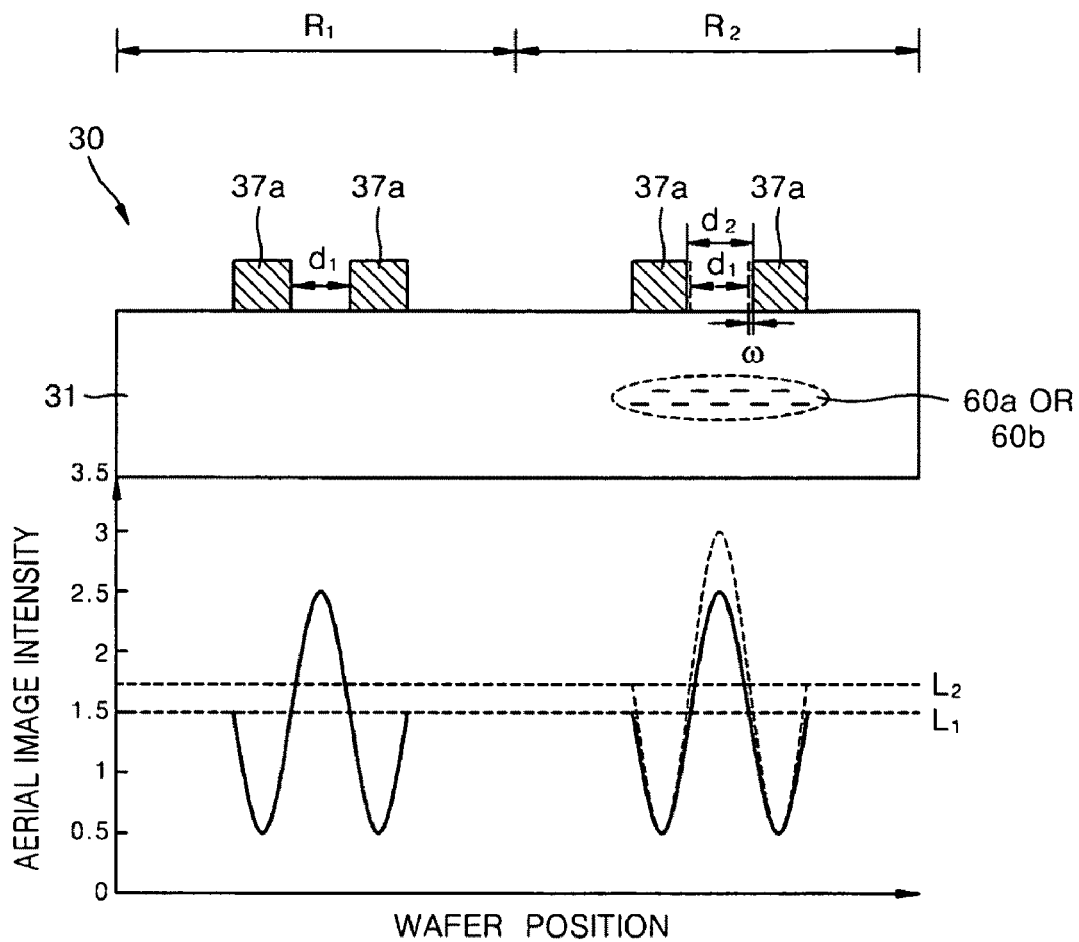
FIG. 12 illustrates a corrected photomask and its aerial image intensity according to an exemplary embodiment.

FIG. 12 illustrates a corrected photomask and its aerial image intensity according to an exemplary embodiment.

Referring to FIG. 12, a diffraction array 60a or 60b is formed in the second region $R_2$ of the photomask 30, thereby adjusting the intensity of the aerial image of the second region $R_2$. In a modified example of this exemplary embodiment, the auxiliary patterns 38a and 38b or the grooves 31a and 31b instead of the diffraction array 60a or 60b may also be formed, as illustrated in FIGS. 9 and 10. In this way, as the intensity of the aerial image becomes uniform, the CD uniformity of the photomask 30 may be obtained.

In the above-described embodiments, the photomask 30 is corrected based on light transmittance but may be corrected based on a reflection index. In this case, in operation S36 of FIG. 4, the reflection index may be adjusted according to the correction map.

Figure 13:
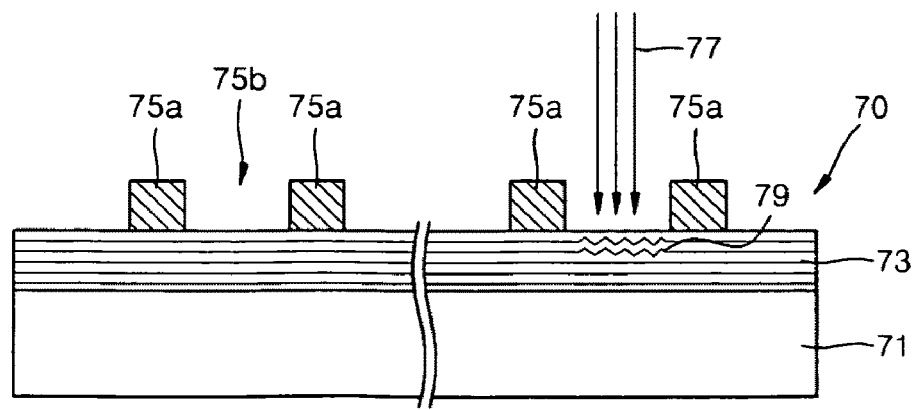
FIG. 13 is a cross-sectional view of a corrected, reflection type photomask according to an exemplary embodiment.

FIG. 13 is a cross-sectional view of a corrected, reflection type photomask according to an exemplary embodiment.

Referring to FIG. 13, a reflection type photomask 70 comprises a reflection layer 73 comprising multiple layers formed on a substrate 71 and absorption patterns 75a formed on the reflection layer 73. An illumination intensity adjusting unit 79 may adjust the intensity of illumination by irradiating a laser 77 on the reflection layer 73 of the photomask 70. When the laser 77 is irradiated on the reflection layer 73, the reflection index of the reflection layer 73 is changed. That is, the thicknesses and material properties of layers of the illumination intensity adjusting unit 79 are changed so that the reflection index of the reflection layer 73 is changed. In this case, the amount of laser irradiation and the area of laser irradiation may be decided by the correction map.

Figure 14:
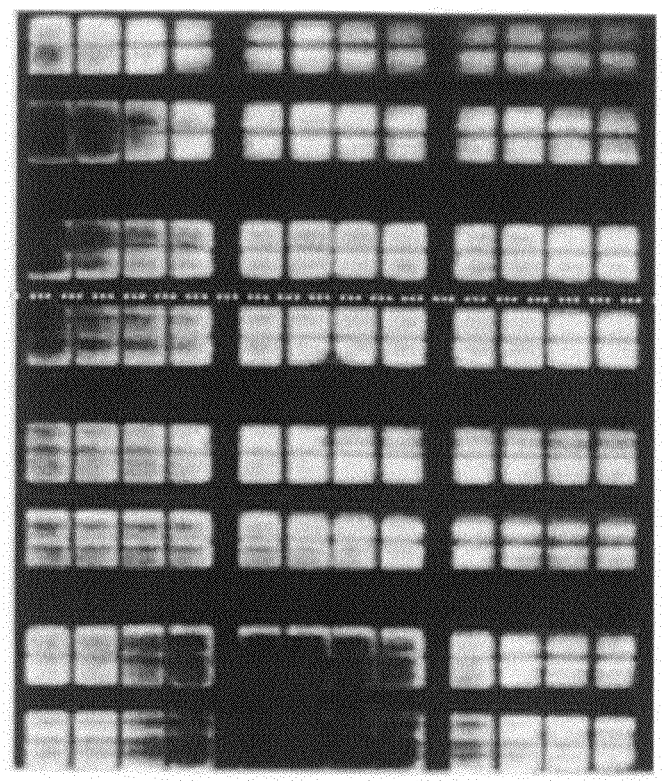
FIGS. 14 and 15 are images showing the CD uniformity of a photomask in which correction according to an experimental example is not performed, and the CD uniformity of a photomask in which correction according to an experimental example is performed, respectively.
Figure 15:
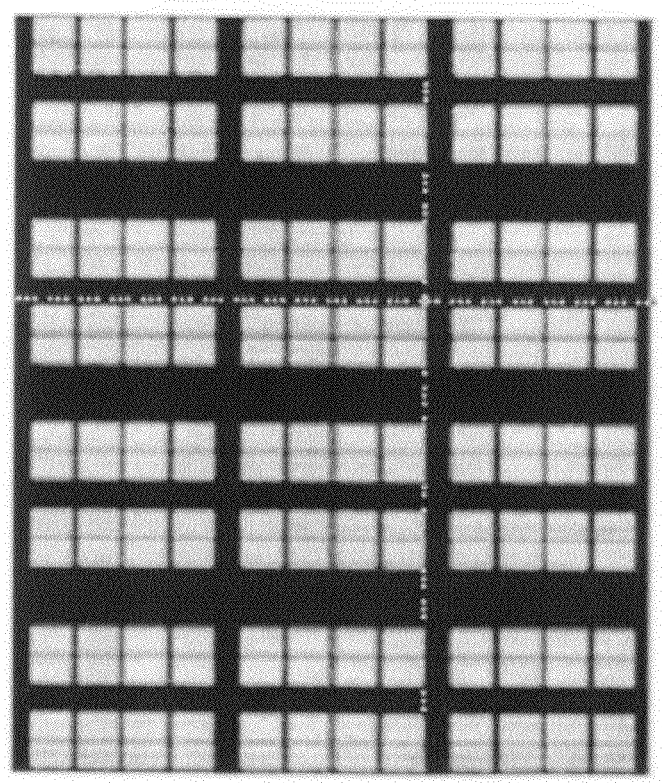

FIGS. 14 and 15 are images showing the CD uniformity of a photomask in which correction according to an experimental example is not performed and the CD uniformity of a photomask in which correction according to an experimental example is performed, respectively.

In FIG. 14, the average of measurement CDs on mask patterns was 32.55 nm, and 3σ(%) indicating that uniformity was 3.7%. In FIG. 15, the average of measurement CDs on the mask patterns was 32.36 nm, and 3σ(%) indicating that uniformity was 1.15%. Thus, the photomask in which correction according to exemplary embodiments is performed shows higher uniformity than the photomask in which correction according to exemplary embodiments is not performed.

While the inventive concept has been particularly shown and described with reference to exemplary embodiments thereof, it will be understood that various changes in form and details may be made therein without departing from the spirit and scope of the invention, as defined by the following claims.

What is claimed is:

1. A method of manufacturing a photomask, the method comprising:
    providing a photomask;
    exposing the photomask with light to obtain an aerial image of the photomask and evaluating the photomask based on the aerial image, wherein the light transmitted to the photomask is not transferred onto a wafer;
    obtaining a percentage dose (illumination intensity) drop value map if an absolute value of a difference between a design CD and a measured CD is not in an allowable range; and
    altering an optical parameter of the photomask associated with the aerial image based on the percentage dose (illumination intensity) drop value map.

2. The method of claim 1, wherein obtaining the aerial image comprises using at least one of −primary light $T_{-1}$ and +primary light $T_{+1}$ together with zero-order $T_0$ light that reacts with the photomask.

3. The method of claim 1, further comprising:
    generating a correction map for making transmittance using the percentage dose (illumination intensity) drop value map.

4. The method of claim 3, further comprising:
    adjusting the transmittance of the photomask based on the correction map by forming a diffraction array, thereby obtaining a diffraction array spot density map.

5. The method of claim 4, wherein the diffraction array spot density map is obtained using $I=1-4(d^2/p^2)$, where I corresponds to a percentage dose (illumination intensity) drop value, d is the diameter of a spot, and p is the pitch of the spot.

6. The method of claim 1, wherein obtaining a percentage dose (illumination intensity) drop value map comprises obtaining CD deviation distribution map and a dose latitude for each section.

7. The method of claim 1, wherein evaluating the photomask comprises comparing a measurement critical dimension (CD) of the aerial image and a design CD of the photomask.

8. The method of claim 7, wherein altering the optical parameter comprises altering a transmittance of the photomask based on the measurement CD and the design CD.

9. The method of claim 8, wherein altering the transmittance of the photomask comprises forming a diffraction array comprising a plurality of spots in the photomask.

10. The method of claim 7, wherein altering the optical parameter comprises altering a reflection index of the photomask based on the measurement CD and the design CD.

11. The method of claim 10, wherein altering the reflection index of the photomask comprises irradiating laser on the photomask.

12. The method of claim 1, wherein the aerial image of the photomask is obtained by a detector, the detector being a charge coupled device (CCD) or a CMOS image sensor (CIS).

13. The method of claim 1, wherein the aerial image of the photomask is realized with zero-order light $T_0$, −primary light $T_{-1}$ and +primary light $T_{+1}$.

14. The method of claim 1, wherein the allowable range is a process margin of the absolute value of the difference between the design CD and the measurement CD in a process using the photomask.

15. A method of manufacturing a photomask, the method comprising:
    providing a photomask;
    exposing the photomask to obtain an aerial image of the photomask and evaluating the photomask based on the aerial image, wherein exposing the photomask to obtain the aerial image comprises using the same illumination system as an illumination system used to transfer a pattern of the photomask onto a wafer; and
    altering an optical parameter of the photomask associated with the aerial image according to the result of evaluation,
    wherein obtaining the aerial image comprises using zero-order light $T_0$, −primary light $T_{-1}$ and +primary light $T_{+1}$ that reacts with the photomask.

16. The method of claim 15, wherein altering the optical parameter comprises altering a transmittance of the photomask based on the measurement CD and the design CD.

17. The method of claim 16, wherein altering a transmittance of the photomask comprises forming a diffraction array comprising a plurality of spots in the photomask.

18. The method of claim 16, wherein altering a transmittance of the photomask comprises at least one of: (i) forming auxiliary patterns beside patterns of the photomask, and (ii) forming grooves in a surface on which patterns of the photomask are formed.

19. The method of claim 15, wherein altering the optical parameter comprises altering the reflection index of the photomask based on the measurement CD and the design CD.

* * * * *